(12) United States Patent
Morita et al.

(10) Patent No.: US 6,431,186 B1
(45) Date of Patent: Aug. 13, 2002

(54) METHOD OF CLEANING ELECTRONIC COMPONENTS

(75) Inventors: Hiroshi Morita; Junichi Ida, both of Tokyo (JP)

(73) Assignee: Kurita Water Industries Ltd., Tokyo (JP)

( * ) Notice: Subject to any disclaimer, the term of this patent is extended or adjusted under 35 U.S.C. 154(b) by 0 days.

(21) Appl. No.: 09/415,488

(22) Filed: Oct. 12, 1999

(30) Foreign Application Priority Data

Oct. 13, 1998 (JP) ............................................. 10-291027

(51) Int. Cl.⁷ ................................................. B08B 7/04
(52) U.S. Cl. ................................. 134/1.3; 134/1; 134/2; 134/3; 134/26; 134/28; 134/30; 216/99
(58) Field of Search ............................ 134/1, 1.3, 2, 3, 134/26, 30, 28, 902; 216/99

(56) References Cited

U.S. PATENT DOCUMENTS 5,983,909 A * 11/1999 Yeol et al. ................ 134/102.1
6,039,815 A * 3/2000 Yeol et al. ...................... 134/2
6,086,057 A * 7/2000 Mitsumori et al. ......... 261/122.1

OTHER PUBLICATIONS

Handbook of Semiconductor Wafer Cleaning Technology. Edited by W.Kern. Noyes Publications, 1993. ISBN: 0–8155–1331–3 pp. 18, 21, 44–52.*

* cited by examiner

*Primary Examiner*—Randy Gulakowski
*Assistant Examiner*—M. Kornakov
(74) *Attorney, Agent, or Firm*—Armstrong, Westerman & Hattori, LLP

(57) ABSTRACT

A simple cleaning method which can remove metal, organic and fine particle contaminants on the surface of electronic components, and especially those on silicon bases, and also suppress an increase in the roughness of base surface on the order of atoms during cleaning processes, is provided by cleaning with an oxidizing cleaning fluid, followed by cleaning with a reducing cleaning fluid with the application of ultrasonic vibrations.

7 Claims, No Drawings

METHOD OF CLEANING ELECTRONIC COMPONENTS

DETAILED DESCRIPTION OF THE INVENTION

1. Field of the Invention

This invention concerns a method of cleaning electronic components. More specifically, this invention pertains to a method of cleaning electronic components that is capable of effectively removing contaminants, such as fine particles which adhere to the surface of a base, without making the surface of the base rough in the wet cleaning process used in industries in which such electronic components such as semiconductor silicon bases are handled.

2. Prior Art

Components such as silicon bases for semiconductors and glass bases for liquid crystals have conventionally been cleaned by RCA cleaning, a heat cleaning method that uses hydrogen peroxide-based concentrated chemical solutions (sulfuric acid+hydrogen peroxide water, hydrochloric acid+ hydrogen peroxide water+water, ammonia+hydrogen peroxide water+water) However, wet cleaning processes began to receive attention in recent years for reasons pertaining to environmental protection and resource conservation.

Against this backdrop, the inventor, et al. earlier proposed a method of cleaning with an oxidizing cleaning fluid, such as ozonated water, to remove mainly metal and organic contaminants, and another cleaning method using a reducing cleaning fluid, such as hydrogenated water, principally for the removal of fine particles.

Needless to say, these two methods, used individually, achieve sufficiently high cleaning effects. However, the synergetic effects from the combination of the two have never been examined closely.

The inventors have found that the concurrent use of ultrasonic waves in the cleaning of bases by a reducing cleaning fluid resulted in extremely high levels of fine particle removal. However, this method, used on a bare silicon surface that has been stripped of an oxidation film, has a disadvantage in that the base surface roughness increases when the strength of ultrasonic waves or the cleaning time is improper, such as when cleaning is performed over a lengthy period of time with a reducing cleaning water to which large ultrasonic waves are applied. In particular, the tendency for an increase in roughness becomes pronounced when an alkaline reducing cleaning water is used.

In the actual cleaning of silicon base surface, holding down the roughness of the silicon surface or that of the silicon/silicon oxidation film interface on the order of atoms is as important as the complete removal of impurities.

Problem that the Invention Aims to Solve

This invention aims to offer a simple and easy cleaning method that can both remove metal, organic and fine particle contaminants on the surface of electronic components, in particular of silicon bases, and also control an increase in the roughness of the base surface on the order of atoms in the cleaning process.

Means of Solving the Problem

The inventors discovered that there was little likelihood of increased surface roughness caused by ultrasonic cleaning with a reducing cleaning fluid to which a chemical solution has been added, as long as the silicon base surface is oxidized prior to cleaning for the purpose of preventing an increase in the roughness of the base surface and a drop in the quality of silicon bases resulting from ultrasonic cleaning that is either too strong or too long in said ultrasonic cleaning. There is no damage to the interface between silicon and silicon oxidation film, which plays an important role in the silicon base functions. Building on these findings, this invention was completed.

Specifically, this invention consists of the inventions described in the following paragraphs.

(1) A method of cleaning electronic components characterized by cleaning of the components with an oxidizing cleaning fluid, followed by cleaning with a reducing cleaning fluid in the presence of ultrasonic vibrations.

(2) The method of cleaning electronic components according to Paragraph (1), wherein the electronic components are bare silicon bases for semiconductors.

(3) The method of cleaning electronic components according to Paragraph (1), wherein the oxidizing cleaning fluid is either ozonated water or ozonated water to which either an acidic or alkaline chemical has been added.

(4) The method of cleaning electronic components according to Paragraph (1), wherein the oxidizing cleaning fluid is either oxygenated water or oxygenated water to which either an acidic or alkaline chemical has been added.

(5) The method of cleaning electronic components according to Paragraph (1), wherein the oxidizing cleaning fluid is a fluid which contains hydrogen peroxide.

(6) The method of cleaning electronic components according to Paragraph (1), wherein the reducing cleaning fluid is either hydrogenated water or hydrogenated water to which either an acidic or alkaline chemicals been added.

(7) The method of cleaning electronic components according to Paragraph (1), wherein the ultrasonic vibrations have frequencies ranging between 400 KHz and 3 MHz.

(8) The method of cleaning electronic components according to paragraph (3), wherein the ozonated concentration in a cleaning fluid is not less than 0.1 mg/liter.

(9) The method of cleaning electronic components according to paragraph (5), wherein the hydrogen peroxide concentration in a cleaning fluid is not less than 200 mg/liter.

(10) The method of cleaning electronic components according to paragraph (6), wherein the hydrogen gas concentration in a cleaning fluid is not less than 0.7 mg/liter.

Mode of Operation of Invention

This invention is a method of cleaning electronic components with a reducing cleaning fluid in the presence of ultrasonic vibrations, following their cleaning with an oxidizing cleaning fluid, and involves a cleaning process in which components are cleaned using a reducing cleaning fluid in the presence of ultrasonic vibrations, either directly following a cleaning process that employs an oxidizing cleaning fluid or via an ultrapure water rinsing process.

The cleaning method of this invention is especially applicable to electronic components which demand strict surface roughness precision such as silicon bases for semiconductors, and glass bases for liquid crystals.

In particular, silicon bases for semiconductors used in this invention can have either a hydrophilic surface finish with an oxidized film on the surface, or a hydrophobic surface finish without an oxidized film The cleaning method of this invention is especially suitable for bare silicon bases for semiconductors and restrains the occurrence of base surface roughness.

In this invention, the initial treatment with an oxidizing cleaning fluid oxidizes the silicon base surface prior to the cleaning process in which a reducing cleaning fluid is used in the presence of ultrasonic vibrations. For this reason, the silicon/silicon oxidization film interface does not get damaged in the second cleaning process. Thus, there is no increase in electronic component (silicon base) surface roughness following the cleaning treatment.

The oxidizing cleaning fluid of this invention is an aqueous solution in which an oxidizing substance has been dissolved.

There is no special restriction on the oxidizing substance used in the oxidizing cleaning fluid. For example, oxidizing substances, such as hydrogen peroxide ($H_2O_2$), ozone ($O_3$) an oxygen ($O_2$); hypochlorites, such as sodium hypochlorite (NaClO) and calcium hypochlorite; chlorites, such as sodium chlorite ($NaClO_2$) and potassium chlorite; and chlorates, such as sodium chlorate ($NaClO_3$) and ammonium chlorate, can be used. These oxidizing substances can be used either singularly or in combination of two or more.

Among these, hydrogen peroxide and ozone are particularly suitable because they are relatively easy to handle, achieve high cleaning effects at low concentration, and place only a minor load on the rinse after cleaning. When hydrogen peroxide is used, it is desirable for the hydrogen peroxide concentration in the cleaning water to be not lower than 200 mg/liter, and more preferably not lower than 1,000 mg/liter. When ozone is used, the ozone concentration in the cleaning water should be not lower than 0.1 mg/liter, and more preferably not less than 1 mg/liter.

Furthermore, fluids which contain these oxidizing substances, supplemented with an acidic or alkaline chemical, can be used. In particular, fluids containing ozonated water to which either an acidic or alkaline chemical is added, and fluids containing oxygenated water to which an acidic or alkaline chemical is added are most suited.

Reducing cleaning fluid used in this invention is water in which a reducing substance is dissolved. There is no special restriction on the reducing substance used here. For example, reducing gases, including hydrogen gas; hyposulfites, such as sodium hyposulfite ($Na_2S_2O_4$) and ammonium hyposulfite; sulfites, such as sodium sulfite ($Na_2SO_3$) and ammonium sulfite; hydrogensulfites, such as sodium hydrogensulfite (NaHSO3), and ammonium hydrogensulfite; nitrites, such as sodium nitrite ($NaNO_2$) and ammonium nitrite; hydrazine; inorganic reducing substances, such as hydrogen sulfide, formic acid and aldehyde, can be used. These reducing substances can be used either singularly or in combination of two or more. Of these, hydrogenated water, in which hydrogen gas has been dissolved, is especially suitable because it achieves high cleaning effects at low concentration, and places only a minor load on the rinse after cleaning. It is desirable for the concentration of hydrogen gas in the water used for cleaning electronic components in this invention to be not lower than 0.7 mg/liter, and more preferably not lower than 1 mg/liter.

An acidic or alkaline chemical maybe added to the aqueous solution in which the reducing substance is dissolved, as the reducing cleaning fluid used in this invention.

This invention is highly effective in cleaning with hydrogenated water to which an alkaline chemical that is effective in removing fine particles is added and used concurrently with ultrasonic waves.

In this invention, the purity of water in which reducing substances or oxidizing substances are dissolved can be set to meet the surface cleanliness demanded of the item to be cleaned. In other words, cleaning water for each cleaning process of this invention is prepared by dissolving either a reducing substance or substances, or an oxidizing substance or substances in the water having a level of purity which is non-contaminated in relation to the level of the surface cleanliness of the item to be cleaned. The water is used in the process in which contaminants on the surface of the item are removed by allowing the water to come into contact with the item to be cleaned.

Consequently, in situations where the item to be cleaned is a simple component that does not require especially strict levels of cleanliness, tap water in which industrial-purpose reducing substances and oxidizing substances have been dissolved can be used as the water for cleaning electronic components.

However, when cleaning the surface of electronic components, such as silicon bases for semiconductors, glass bases for liquid crystals, quartz bases for photomasks and of other precision electronic components, it is desirable to use ultrapure water having sufficiently high purity and dissolve reducing substances of high purity or oxidizing substances of high purity. It is desirable for ultrapure water to have an electric resistance rate not lower than 18 MΩ·cm at 25° C., and contain not more than 10 μg/liter of organic carbons, and not more than 10,000 particles per liter. Furthermore, minute foreign particles in the cleaning water for electronic components can be removed through a filter if necessary.

In the process of cleaning with a reducing cleaning fluid of this invention, ultrasonic waves are applied to the reducing cleaning fluid in order to facilitate cleaning. Ultrasonic vibrations are excellent as a supplementary cleaning tool because they do not damage the surface of electronic components.

There is no particular restriction as to the methods of applying ultrasonic waves to reducing cleaning fluids of this invention. For example, in batch cleaning, ultrasonic vibrations can be delivered to a tank in which cleaning fluid for electronic components is stored. In spin cleaning, ultrasonic vibrations can be delivered to the nozzle from which the cleaning fluid for electronic components is sprayed.

The frequency of the ultrasonic waves applied to the ultrasonic wave cleaning process of this invention is desired to be between 20 KHz and 3 MHz, and more preferably between 400 KHz and 3 MHz. Ultrasonic wave frequencies of below 20 KHz can result in inadequate removal of fine particles from electronic components which are contaminated with fine particles. Frequencies in excess of 3 MHz do not produce improved effects commensurate with the higher frequencies.

As the result of the treatment with oxidizing cleaning fluids described above, organic and metal contaminants can be removed from the surface of electronic components, and an oxidization film is formed on the surface of the components. In the ensuing cleaning with reducing cleaning water, fine particles which adhere to the surface of electronic components are removed. As the result of this series of cleaning processes employing oxidizing cleaning water and reducing cleaning water, all contaminants, including organic matter, metals and fine particles, are removed.

In the removal of fine particles that adhere to bare silicon, no increase occurs between the surface roughness of the bare silicon, which is the raw material, and that of silicon bases after cleaning if components are pre-treated with an oxidizing fluid, followed by a reducing cleaning fluid unlike when the conventional cleaning method is used wherein components are cleaned directly with a reducing cleaning fluid.

Therefore, when there is a cleaning process which precedes the preparation of bare silicon bases from silicon which has an oxidization film, by means of a cleaning treatment with a hydrofluoric acid chemical, such as a dilute hydrofluoric acid (DHF) cleaning fluid; cleaning with the buffered hydrofluoric acid (dilute hydrofluoric acid and ammonium fluoride); or dry treatment with anhydrous hydrofluoric acid gas, it is desirable that cleaning of this invention is performed following the first cleaning.

If it is necessary to give a hydrophobic surface finish stripped of an oxidation film to silicon that has been cleaned by the cleaning method of this invention, cleaning with a chemical solution, such as that of DHF, that is capable of dissolving a silicon oxidation film will result in a silicon surface that retains low roughness as measured on the same atomic orders as the raw material silicon.

If, on the other hand, a hydrophilic surface finish with an oxidation film is desired, the silicon treated with the cleaning method of this invention can be used without further treatment. Furthermore, a low-roughness silicon oxidization film surface that reflects the roughness of the raw material silicon surface can also be obtained by applying an oxidation treatment with ozonated water, etc. after an oxidation film is once dissolved with DHF as described above.

EXAMPLES

In the following section, this invention is explained in further detail by using examples. This invention, however, is not limited in any way by these examples.

In blank tests, examples and comparative examples, cleaning effects were evaluated using the following method:
(1) Item to be Cleaned Bare silicon bases having a diameter of 6 in. were submerged in ultrapure water, containing alumina particles having a diameter of not more than 1 μm and divalent copper ions, for 3 minutes, and rinsed with ultrapure water to create contaminated silicon bases. These prepared silicon bases were used as the items to be cleaned.

The contaminated silicon bases had between 20,000 and 25,000 particles per base, and adhered copper in the amounts of IE+14 atoms/cm$^2$.
(2) Cleaning Operation After the contaminated silicon bases were cleaned wit 0.5% dilute hydrofluoric acid, they were cleaned with ozonated water, having the concentration of 5 ppm, as an oxidizing cleaning fluid, followed by cleaning with hydrogenated water, having the concentration of 1.2 ppm, under the application of ultrasonic vibrations by a nozzle that generates ultrasonic vibrations having the frequency of 1.6 MHz.

All cleaning operation were performed by spin cleaning at the rotation speed of 500 rpm.

Cleaning water used in the tests was supplied at 0.8 liter/min.

Treatment duration in individual processes in the examples and comparative examples were as follows:
Dilute hydrofluoric acid (0.5%) treatment process:
1 minute
Ozonated water (5 ppm) treatment process:
1 minute
Hydrogenated water (1.2 ppm) treatment process:
0.2 or 2 minutes.

The time for the hydrogenated water treatment process was set longer in this test than the time required in normal cleaning in order to allow surface damage effects to emerge more readily.

Following each step and also after the final step, ultrapure water rinsing was performed for 10 seconds.

The following blank tests were conducted to provide criterion for test evaluation:
Blank Test No.1: Ozonated water cleaning only.
Blank Test No. 2: Ozonated water cleaning+dilute hydrofluoric acid treatment
Blank Test No.3: Hydrogenated water cleaning (0.2 minute)-(A)
Ammonia-added hydrogenated water cleaning (0.2 minute)-(B)
Blank Test No.4: Hydrogenated water cleaning (2 minutes)-(A)
Ammonia-added hydrogenated water cleaning (2 minutes)-(B)
(3) Evaluation
(3-1) Fine Particle Removal Rate Fine particles were measured using base surface foreign particle testing equipment by the laser scatter method. Particle removal rates were computed by comparing particle counts before and after cleaning.
(3-2) Copper Removal Rate Concentration of copper on the surface was measured by the total reflection fluorescent X-ray spectroscopy. Copper removal rates were computed based on copper concentration before and after cleaning.
(3-3) Surface Roughness (Increases in irregularity at the atomic level)

Samples were cut to 10 mm squares. The maximum height/depth distance in the 5μ×5μ square at the center of the sample was measured by AFM (atomic force microscope). Standard untreated bare silicon values ranged between 23 and 25 nm. Those whose post-cleaning values were not more than 27 nm were evaluated to have had "no increase in the roughness". Those whose values exceeded 27 nm were evaluated to have had "an increase in the roughness".

Example 1

The above-mentioned bare silicon bases, which arc the items to be cleaned, were cleaned with hydrogenated water (1.2 ppm) (A) for 0.2 minutes, and hydrogenated water (1.2 ppm) to which 1 ppm of ammonia had been added (B) for 0.2 minutes, under the application of ultrasonic waves, after they were treated in the above-described 1 -minute dilute hydrofluoric acid treatment process and 1-minute ozonated water treatment process.

The cleaned items were evaluated using the above-described evaluation method.

Example 2

Bases were cleaned under conditions identical to those in Example 1 with the exception of the hydrogenated water treatment time, which was changed to 2 minutes.

Example 3

Silicon bases, cleaned by the same way as under Example 2, were treated with dilute hydrofluoric acid to give a hydrophobic surface finish, and evaluated.

Example 4

Silicon bases, cleaned and treated with dilute hydrofluoric acid to produce a hydrophobic surface finish as under Example 3, were treated with ozonated water to create a hydrophilic surface finish, and evaluated.

COMPARATIVE EXAMPLE 1

Altering the order of the cleaning processes in Example 1, a 1-minute dilute hydrofluoric acid treatment was followed first by a 0.2-minute hydrogenated water treatment, and then a 1-minute ozonated water treatment.

The conditions of individual treatment processes were held the same as in Example 1.

COMPARATIVE EXAMPLE 2

Altering the order of the cleaning processes in Example 2, a 1-minute dilute hydrofluoric acid treatment was followed first by a 2-minute hydrogenated water treatment, and then a 1-minute ozonated water treatment.

The conditions of individual treatment processes were held the same as in Example 2.

COMPARATIVE EXAMPLE 3

Altering the order of the cleaning processes in Example 3, a 1-minute dilute hydrofluoric acid treatment was followed first by a 2-minute hydrogenated water treatment, and then a 1-minute ozonated water treatment. Additionally, a dilute hydrofluoric acid treatment was given.

The conditions of individual treatment processes were held the same as in Example 3.

COMPARATIVE EXAMPLE 4

Altering the order of the cleaning processes in Example 4, a 1-minute dilute hydrofluoric acid treatment was followed first by a 2-minute hydrogenated water treatment, and then a 1-minute ozonated water treatment. Additionally, a dilute hydrofluoric acid treatment was given, followed by an ozonated water treatment.

The conditions of individual treatment processes were held the same as in Example 4.

Table 1 shows a summary of the evaluation performed on the cleaning results of the silicon bases in the above-described blank tests, examples and comparative examples under their respective treatment conditions.

TABLE 1

|  | Surface Finish | Fine Particle Removal Rate (%) | Copper Removal Rate (%) | Increase in Roughness at the Atomic Level |
|---|---|---|---|---|
| Blank Test 1 | Hydrophilic | 10 | 99< | None |
| Bland Test 2 | Hydrophobic | 50 | 99< | None |
| Blank Test 3 | | | | |
| A | Hydrophilic | 85 | <10 | None |
| B | Hydrophilic | 96 | <10 | None |
| Blank Test 4 | | | | |
| A | Hydrophilic | 99 | <10 | None |
| B | Hydrophilic | 100 | <10 | None |
| Example 1 | | | | |
| A | Hydrophilic | 89 | 99< | None |
| B | Hydrophilic | 97 | 99< | None |
| Example 2 | | | | |
| A | Hydrophilic | 99 | 99< | None |
| B | Hydrophilic | 100 | 99< | None |
| Example 3 | | | | |
| A | Hydrophobic | 99 | 99< | None |
| B | Hydrophobic | 100 | 99< | None |
| Example 4 | | | | |
| A | Hydrophilic | 99 | 99< | None |
| B | Hydrophilic | 100 | 99< | None |
| Comparative Example 1 | | | | |
| A | Hydrophilic | 84 | 99< | None |
| B | Hydrophilic | 93 | 99< | None |
| Comparative Example 2 | | | | |
| A | Hydrophilic | 99 | 99< | Increase (32 nm) |
| B | Hydrophilic | 99 | 99< | Increase (43 nm) |
| Comparative Example 3 | | | | |
| A | Hydrophobic | 99 | 99< | Increase (33 nm) |
| B | Hydrophobic | 99 | 99< | Increase (44 nm) |
| Comparative Example 4 | | | | |
| A | Hydrophilic | 99 | 99< | Increase (32 nm) |
| B | Hydrophilic | 100 | 99< | Increase (41 nm) |

Based on the results of this table, oxidation treatment given prior to ultrasonic cleaning by hydrogenated water ensures the prevention of an increase in roughness on the base surface on the order of atoms.

Effects of the Invention

The cleaning method of this invention not only achieves high cleaning effects with respect to metals, organic matter and fine particles but also enables the maintenance of roughness at low levels on the order of atoms.

What is claimed is:

1. A method of cleaning electronic components comprising:
   cleaning the electronic components with a cleaning fluid of hydrofluoric acid and then with an oxidizing cleaning fluid selected from the group consisting of ozonated water, ozonated and oxygenated water to which an acidic or alkaline chemical has been added, and hydrogen peroxide; and
   then cleaning the electronic components with a reducing cleaning fluid while the electronic components are subjected to ultrasonic vibrations.

2. The method of cleaning electronic components according to claim 1, wherein said electronic components are bare silicon bases for semiconductors.

3. The method of cleaning electronic components according to claim 1, wherein said reducing cleaning fluid is either hydrogenated water or hydrogenated water to which an acidic or alkaline chemical is added.

4. The method of leaning electronic components according to claim 1, wherein said ultrasonic vibrations have frequencies between 400 KHz and 3 MHz.

5. The method of cleaning electronic components according to claim 1, wherein said ozone concentration in a cleaning fluid is not less than 0.1 mg/liter.

6. The method of cleaning electronic components according to claim 1, wherein said hydrogen peroxide concentration in a cleaning fluid is not less than 200 mg/liter.

7. The method of cleaning electronic components according to claim 3, wherein said hydrogen gas concentration in a cleaning fluid is not less than 0.7 mg/liter.

* * * * *